(12) United States Patent
Long et al.

(10) Patent No.: US 10,304,821 B2
(45) Date of Patent: May 28, 2019

(54) ELECTROSTATIC DISCHARGE (ESD) CIRCUIT, ARRAY SUBSTRATE AND DISPLAY DEVICE

(71) Applicant: BOE Technology Group Co., Ltd., Beijing (CN)

(72) Inventors: Chunping Long, Beijing (CN); Jianbo Xian, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/562,853

(22) PCT Filed: Mar. 14, 2017

(86) PCT No.: PCT/CN2017/076649
§ 371 (c)(1),
(2) Date: Sep. 28, 2017

(87) PCT Pub. No.: WO2017/185894
PCT Pub. Date: Nov. 2, 2017

(65) Prior Publication Data
US 2018/0190645 A1    Jul. 5, 2018

(30) Foreign Application Priority Data
Apr. 26, 2016    (CN) .................... 2016 2 0363192 U (51) Int. Cl.
*H01L 27/02* (2006.01)
*H01L 27/12* (2006.01)
(Continued)

(52) U.S. Cl.
CPC .... *H01L 27/0266* (2013.01); *G02F 1/136204* (2013.01); *G09G 3/3648* (2013.01);
(Continued)

(58) Field of Classification Search
CPC ..... H01L 29/78; H01L 29/66; H01L 27/0266; H01L 27/1251; H01L 27/3262; G02F 1/1345; H02H 9/00; G09G 3/36
(Continued)

(56) References Cited

U.S. PATENT DOCUMENTS 6,297,867 B1 * 10/2001 Miyahara .............. G02F 1/1345
349/141
6,442,079 B2 * 8/2002 Lee ........................ G11C 16/30
365/189.09
(Continued)

FOREIGN PATENT DOCUMENTS

CN    101517629 A    8/2009
CN    102651366 A    8/2012
(Continued)

OTHER PUBLICATIONS

English translation of CN205621414.*
Jun. 5, 2017—International Search Report and Written Opinion Appn PCT/CN2017/076649 with Eng Tran.

*Primary Examiner* — Sheikh Maruf
(74) *Attorney, Agent, or Firm* — Banner & Witcoff, Ltd.

(57) ABSTRACT

An electrostatic discharge (ESD) circuit, an array substrate and a display device are provided. The ESD circuit including a first signal line, a second signal line and a first thin film transistor (TFT), wherein the first TFT includes a plurality of first sub-TFTs; each first sub-TFT includes a first source electrode and a first drain electrode; the first sub-TFTs are sequentially arranged; adjacent first sub-TFT share one first source electrode or first drain electrode; one of the first signal line and the second signal line is electrically connected with the first drain electrode of each first sub-TFT; and the other is electrically connected with the first source electrode of each first sub-TFT.

20 Claims, 6 Drawing Sheets

(51) Int. Cl.
*H01L 27/32* (2006.01)
*H02H 9/00* (2006.01)
*G09G 3/36* (2006.01)
*G02F 1/1362* (2006.01)
*G02F 1/1345* (2006.01)

(52) U.S. Cl.
CPC ...... *H01L 27/1214* (2013.01); *H01L 27/1251* (2013.01); *H02H 9/00* (2013.01); *G02F 1/1345* (2013.01); *G09G 2300/0809* (2013.01); *G09G 2320/0209* (2013.01); *G09G 2330/04* (2013.01); *H01L 27/3262* (2013.01)

(58) Field of Classification Search
USPC .................................................. 257/43, 72
See application file for complete search history.

(56) References Cited

U.S. PATENT DOCUMENTS

| | | | | |
|---|---|---|---|---|
| 6,486,933 B1* | 11/2002 | Cha | .................. | G02F 1/134363 349/110 |
| 6,587,170 B2* | 7/2003 | Shin | .................. | G02F 1/133512 349/110 |
| 6,970,336 B2* | 11/2005 | Stockinger | .......... | H01L 27/0251 361/111 |
| 2002/0131003 A1* | 9/2002 | Matsumoto | ........... | G02F 1/1345 349/139 |
| 2004/0140839 A1* | 7/2004 | Nagao | .................... | G11C 19/00 327/291 |
| 2004/0196240 A1* | 10/2004 | Koyama | .............. | G09G 3/3674 345/92 |
| 2004/0253781 A1* | 12/2004 | Kimura | ......... | H03K 19/018507 438/222 |
| 2005/0220262 A1* | 10/2005 | Moon | .................... | G11C 19/00 377/64 |
| 2006/0119757 A1* | 6/2006 | Tsao | .................... | G02F 1/136204 349/40 |
| 2006/0145951 A1* | 7/2006 | Watanabe | ......... | G02F 1/136204 345/55 |
| 2006/0181823 A1* | 8/2006 | Miller | ................. | H01L 27/0251 361/56 |
| 2006/0274466 A1* | 12/2006 | Rice | .................... | H01L 27/0266 361/56 |
| 2007/0176176 A1* | 8/2007 | Yamazaki | ............ | G09G 3/3233 257/59 |
| 2008/0007296 A1* | 1/2008 | Umezaki | .................. | G09G 3/20 326/62 |
| 2008/0012816 A1* | 1/2008 | Moon | ................... | G11C 19/184 345/100 |
| 2008/0062112 A1* | 3/2008 | Umezaki | ................ | G09G 3/342 345/100 |
| 2008/0079685 A1* | 4/2008 | Umezaki | .............. | G09G 3/3677 345/100 |
| 2009/0224245 A1* | 9/2009 | Umezaki | ................ | G11C 19/28 257/59 |
| 2010/0072493 A1* | 3/2010 | Miyamoto | ............ | H01L 27/124 257/88 |
| 2010/0134396 A1* | 6/2010 | Umezaki | .............. | G09G 3/3413 345/92 |
| 2010/0245307 A1* | 9/2010 | Kimura | ................ | G09G 3/3677 345/206 |
| 2011/0057190 A1* | 3/2011 | Kimura | ................ | H01L 27/088 257/59 |
| 2012/0087460 A1* | 4/2012 | Moriwaki | ........... | H01L 27/0255 377/64 |
| 2012/0292624 A1* | 11/2012 | Lv | ........................ | H01L 27/1288 257/59 |
| 2015/0137118 A1* | 5/2015 | Umezaki | .............. | G09G 3/3677 257/43 |
| 2015/0187878 A1* | 7/2015 | Yamazaki | ............ | H01L 27/1225 257/43 |
| 2015/0279835 A1* | 10/2015 | Moriwaki | ........... | H01L 27/0266 257/72 |
| 2015/0379923 A1* | 12/2015 | Lee | ....................... | G09G 3/3233 345/206 |
| 2016/0071834 A1* | 3/2016 | Zhang | ................. | H01L 27/1214 257/72 |

FOREIGN PATENT DOCUMENTS

| | | | | |
|---|---|---|---|---|
| CN | 102651547 A | | 8/2012 | |
| CN | 205621414 U | * | 10/2016 | ............... G09G 3/36 |
| CN | 205665504 U | | 10/2016 | |

\* cited by examiner

ELECTROSTATIC DISCHARGE (ESD) CIRCUIT, ARRAY SUBSTRATE AND DISPLAY DEVICE

The application is a U.S. National Phase Entry of International Application No. PCT/CN2017/076649 filed on Mar. 14, 2017, designating the United States of America and claiming priority to Chinese Patent Application No. 201620363192.7 filed on Apr. 26, 2016. The present application claims priority to and the benefit of the above-identified applications and the above-identified applications are incorporated by reference herein in their entirety.

TECHNICAL FIELD

At least one embodiment of the present disclosure relates to an electrostatic discharge (ESD) circuit, an array substrate and a display device.

BACKGROUND

In the structural design of a thin film transistor liquid crystal display (TFT-LCD), a peripheral circuit of an array substrate includes an ESD circuit, gate scanning lines, data lines, common electrode lines, repair lines, test lines, etc. A high-end display panel generally has the characteristic of high resolution and narrow bezel. As numerous peripheral circuits are disposed in a peripheral circuit region, large parasitic capacitance load tends to be formed, so signal delay and poor display tend to occur. Meanwhile, large circuit area is also unfavorable for the implementation of a narrow-bezel panel.

SUMMARY

At least one embodiment of the present disclosure relates to an ESD circuit, an array substrate and a display device, which improve the width to length (W/L) ratio of a first TFT and improve the current load capacity in the case of discharge.

At least one embodiment of the present disclosure provides an electrostatic discharge (ESD) circuit, comprising a first signal line, a second signal line and a first thin film transistor (TFT), wherein the first TFT comprises a plurality of first sub-TFTs; each first sub-TFT comprises a first source electrode and a first drain electrode; the first sub-TFTs are sequentially arranged; adjacent first sub-TFTs share one first source electrode or first drain electrode; the first signal line is electrically connected with the first drain electrode of each first sub-TFT; and the second signal line is electrically connected with the first source electrode of each first sub-TFT.

At least one embodiment of the present disclosure further provides an array substrate, comprising the ESD circuit according to any one of the embodiments of the disclosure.

At least one embodiment of the present disclosure further provides a display device, comprising the array substrate according to any one of the embodiments of the disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the present disclosure, thin film transistor is abbreviated as TFT. Correspondingly, first thin film transistor is abbreviated as first TFT, and second thin film transistor is abbreviated as second TFT. First sub-thin film transistor is abbreviated as first sub-TFT, and second sub-thin film transistor is abbreviated as second sub-TFT. Moreover, in the present disclosure, source electrode and drain electrode are relative to each other and may replace each other. For instance, when a source electrode is replaced by a drain electrode, the drain electrode is also replaced by the source electrode. In the accompanying drawings, "S" represents source electrode and "D" represents drain electrode.

At least one embodiment of the present disclosure provides an ESD circuit, which comprises a first signal line, a second signal line and a first TFT. The first TFT includes a plurality of first sub-TFTs. The first sub-TFTs are in parallel connection.

Each first sub-TFT includes a first source electrode and a first drain electrode; the first sub-TFTs are sequentially arranged; adjacent first sub-TFTs share one first source electrode or first drain electrode; and one of the first signal line and the second signal line is electrically connected with the first drain electrode of each first sub-TFT, and the other is electrically connected with the first source electrode of each first sub-TFT. For instance, two adjacent first sub-TFTs include two first source electrodes and a first drain electrode disposed between the two first source electrodes, and the first drain electrode is shared by the two adjacent first sub-TFTs; or the two adjacent first sub-TFTs include two first drain electrodes and a first source electrode disposed between the two first drain electrodes, and the first source electrode is shared by the two adjacent first sub-TFTs.

For instance, the ESD circuit provided by at least one embodiment of the present disclosure further comprises a third signal line and a second TFT. The second TFT includes a plurality of second sub-TFTs. The second sub-TFTs are in parallel connection. Each second sub-TFT includes a second source electrode and a second drain electrode; the second sub-TFTs are sequentially arranged; adjacent second sub-TFTs share one second source electrode or second drain electrode; and one of the first signal line and the third signal line is electrically connected with the second source electrode of each second sub-TFT, and the other is electrically connected with the second drain electrode of each second sub-TFT. For instance, in the embodiment of the present disclosure, "sequentially arranged" refers to sequential arrangement in the same plane, and moreover, for instance, being arranged in a line in the same plane, but not limited thereto.

It should be noted that the second TFT can adopt the structure in which the second sub-TFTs are in parallel connection, and can also adopt any other structure, which is not limited in the embodiment of the present disclosure. Moreover, the ESD circuit can also comprise other TFTs apart from the first TFT and the second TFT, which is not limited in the embodiment of the present disclosure.

The ESD circuit provided by at least one embodiment of the present disclosure can improve the W/L ratio of the first TFT and/or the second TFT and improve the current load capacity in the case of discharge. Current is generally in direct proportion to the W/L ratio of the TFT. For instance, when the first TFT includes four first sub-TFTs or the second TFT includes four second sub-TFTs, compared with the case of only including one first sub-TFT or second sub-TFT, the current load capacity of the first TFT or the second TFT can be improved by a factor of four, and correspondingly, the W/L ratio is also improved by a factor of four. Thus, the present disclosure realizes the ESD circuit and the TFTs providing large current and having high W/L ratio, on the premise of not increasing the area of peripheral circuits and the capacitance load of the signal lines. Meanwhile, the nonuniformity of large-width patterns can be also reduced.

It should be noted that the electrical connection mode is not limited in the present disclosure. For instance, direct electrical connection or integral forming can be adopted, or electrical connection via through holes can also be adopted, as long as electrical connection can be achieved.

Positive electrostatic charges or negative electrostatic charges can be accumulated on the first signal line. The electrostatic charges on the first signal line are released to the second signal line through the first TFT or to the third signal line through the second TFT. For instance, the positive electrostatic charges accumulated on the first signal line are released through the first TFT and the second signal line, and negative electrostatic charges accumulated on the first signal line are released through the second TFT and the third signal line, or the negative electrostatic charges accumulated on the first signal line are released through the first TFT and the second signal line, and the positive electrostatic charges accumulated on the first signal line are released through the second TFT and the third signal line. For instance, the first signal line can be a data line, a gate line, a clock signal line or the like in an array substrate, no limitation will be given here. The array substrate, for instance, is a substrate of a liquid crystal display (LCD) panel or an organic light-emitting diode (OLED) display panel, and no limitation will be given here, as long as the array substrate include signal lines ready for ESD. For instance, the second signal line and/or the third signal line can also be electrically connected with a common electrode, so as to better release the electrostatic charges, which is not limited thereto. For instance, the second signal line and the third signal line can be two different signal lines and can also be electrically connected. No limitation will be given here in the embodiment of the present disclosure.

For instance, in the ESD circuit provided by one embodiment of the present disclosure, the first TFT and the second TFT are in series connection. For instance, the third signal line is electrically connected with the plurality of second drain electrodes of the second TFT, and the second source electrodes of the second sub-TFTs in the second TFT are electrically connected with the first signal line through at least one first drain electrode or first source electrode of at least one first sub-TFT; or the third signal line is electrically connected with the plurality of second source electrodes of the second TFT, and the second drain electrodes of the second sub-TFTs in the second TFT are electrically connected with the first signal line through at least one first drain electrode or first source electrode of at least one first sub-TFT. Thus, at least one first drain electrode or first source electrode of at least one first sub-TFT in the first TFT can be simultaneously taken as a connecting line, so that the occupied area of the entire ESC circuit can be reduced.

For instance, in the ESD circuit provided by one embodiment of the present disclosure, one of the second signal line and the third signal line is configured to apply a high level signal and taken as a high level signal line, and the other is configured to apply a low level signal and taken as a low level signal line, which is not limited thereto. For instance, in the present disclosure, the positive electrostatic charges accumulated on the first signal line are released through the high level signal line, and the negative electrostatic charges accumulated on the first signal line are released through the low level signal line. For instance, the charges are led out through one TFT, for instance, the first TFT or the second TFT, in the case of releasing the electrostatic charges. For instance, the electrostatic charges are released to the second signal line through the first TFT or to the third signal line through the second TFT. Of course, the second signal line and the third signal line can also be equal level signal lines, which is not limited in the embodiment of the present disclosure. For instance, the electric potential on the second signal line and the third signal line is 0, which is not limited in the embodiment of the present disclosure.

For instance, in the ESD circuit provided by one embodiment of the present disclosure, the first sub-TFT includes a first gate electrode which is electrically connected with the first drain electrode; and the second sub-TFT includes a second gate electrode which is electrically connected with the second drain electrode. Thus, a diode can be formed by the first sub-TFT and the second sub-TFT. Correspondingly, a diode is respectively formed by the first TFT and the second TFT. Therefore, the circuit layout design can be simplified. Of course, the first gate electrode can also be electrically connected with the first source electrode, and the second gate electrode can also be electrically connected with the second source electrode. No limitation will be given here.

For instance, in the ESD circuit provided by one embodiment of the present disclosure, the first gate electrodes of the plurality of first sub-TFTs in the first TFT are electrically connected with each other; and the second gate electrodes of the plurality of second sub-TFTs in the second TFT are electrically connected with each other. Thus, the transmission of gate signals can be convenient.

For instance, in the ESD circuit provided by one embodiment of the present disclosure, the first sub-TFT is a dual gate TFT and the second sub-TFT is a dual gate TFT. The arrangement of the dual gate TFT can reduce the leakage current of the TFT in the normal operating state, and hence reduce poor display caused by signal crosstalk. Of course, the dual gate TFTs can also be not adopted. No limitation will be given here.

For instance, in the ESD circuit provided by one embodiment of the present disclosure, the first signal line, the first gate electrodes of the first sub-TFTs, and the second gate electrodes of the second sub-TFTs are formed by a first thin film. Thus, the manufacturing process can be simplified. It should be noted that the embodiment of the present disclosure is not limited thereto. For instance, the first thin film can be formed by a sputtering method, which is not limited thereto.

For instance, in the ESD circuit provided by one embodiment of the present disclosure, the first source electrodes and the first drain electrodes of the first sub-TFTs, the second source electrodes and the second drain electrodes of the second sub-TFTs, the second signal line and the third signal line are formed by a second thin film. Thus, the manufacturing process can be simplified. It should be noted that the embodiment of the present disclosure is not limited thereto. For instance, the second thin film can be formed by a sputtering method, which is not limited thereto.

For instance, in the ESD circuit provided by one embodiment of the present disclosure, the second signal line includes a plurality of branches; the plurality of branches of the second signal line is taken as the plurality of first source electrodes or the plurality of first drain electrodes of the first TFT; the third signal line includes a plurality of branches; and the plurality of branches of the third signal line is taken as the plurality of second drain electrodes or the plurality of second source electrodes of the second TFT. Thus, the second signal line and the plurality of first source electrodes or the plurality of first drain electrodes of the first TFT can be integrally formed, and the third signal line and the plurality of second drain electrodes or the plurality of second source electrodes of the second TFT can be integrally formed. Therefore, the manufacturing process can be simplified, and the occupied area of the ESD circuit can be reduced. It should be noted that the second signal line and the plurality of first source electrodes or the plurality of first drain electrodes of the first TFT, and the third single line and the plurality of second drain electrodes or the plurality of second source electrodes of the second TFT can also be not integrally formed but connected with each other by other means, for instance, via through holes. No limitation will be given here.

For instance, in the ESD circuit provided by one embodiment of the present disclosure, the first TFT includes a first active layer; the first sub-TFTs of the first TFT respectively adopt different parts of the first active layer of the first TFT; the second TFT includes a second active layer; and the second sub-TFTs of the second TFT respectively adopt different parts of the second active layer of the second TFT. For instance, the first source electrodes and the first drain electrodes of the first sub-TFTs are respectively connected with the first active layer of the first TFT via through holes; and the second source electrodes and the second drain electrodes of the second sub-TFTs are respectively connected with the second active layer of the second TFT via through holes.

For instance, in the ESD circuit provided by one embodiment of the present disclosure, the first TFT is an N-type TFT or a P-type TFT, and the second TFT is an N-type TFT or a P-type TFT. For instance, both the first TFT and the second TFT can be N-type TFTs or P-type TFTs, or one can be an N-type TFT and the other can be a P-type TFT. No limitation will be given here.

For instance, in the ESD circuit provided by one embodiment of the present disclosure, both the number of the first sub-TFTs in the first TFT and the number of the second sub-TFTs in the second TFT are greater than or equal to 4. For instance, both the number of the first sub-TFTs in the first TFT and the number of the second sub-TFTs in the second TFT are greater than or equal to 4 and less than or equal to 8. Thus, the occupied area and the product performance can be taken into account simultaneously. But the embodiment of the present disclosure is not limited thereto.

Description will be given below with reference to several embodiments.

In the following embodiments, both the first TFT and the second TFT include a plurality of sub-TFTs; the number of the first sub-TFTs in the first TFT is 4; the number of the second sub-TFTs in the second TFT is 4; the first signal line, the first gate electrodes of the first sub-TFTs, and the second gate electrodes of the second sub-TFTs are formed by a first thin film; the first source electrodes and the first drain electrodes of the first sub-TFTs, the second source electrodes and the second drain electrodes of the second sub-TFTs, the second signal line and the third signal line are formed by a second thin film; the plurality of branches of the second signal line is taken as the plurality of first source electrodes or the plurality of first drain electrodes of the first TFT; and the plurality of branches of the third signal line is taken as the plurality of second drain electrodes or the plurality of second source electrodes of the second TFT. Description is given in the embodiments of the present disclosure by taking the above as an example. But no limitation will be given here.

It should be noted that: in the following embodiments, in the N-type TFT, the source electrode is in low level and the drain electrode is in high level, and the N-type TFT can be switched on by positive gate voltage (the gate-source voltage difference is greater than 0). In the P-type TFT, the source electrode is in high level and the drain electrode is in low level, and the P-type TFT can be switched on by negative gate voltage (the gate-source voltage difference is less than 0). The gate electrode is electrically connected with the drain electrode to form a diode.

First Embodiment

Figure 1A:
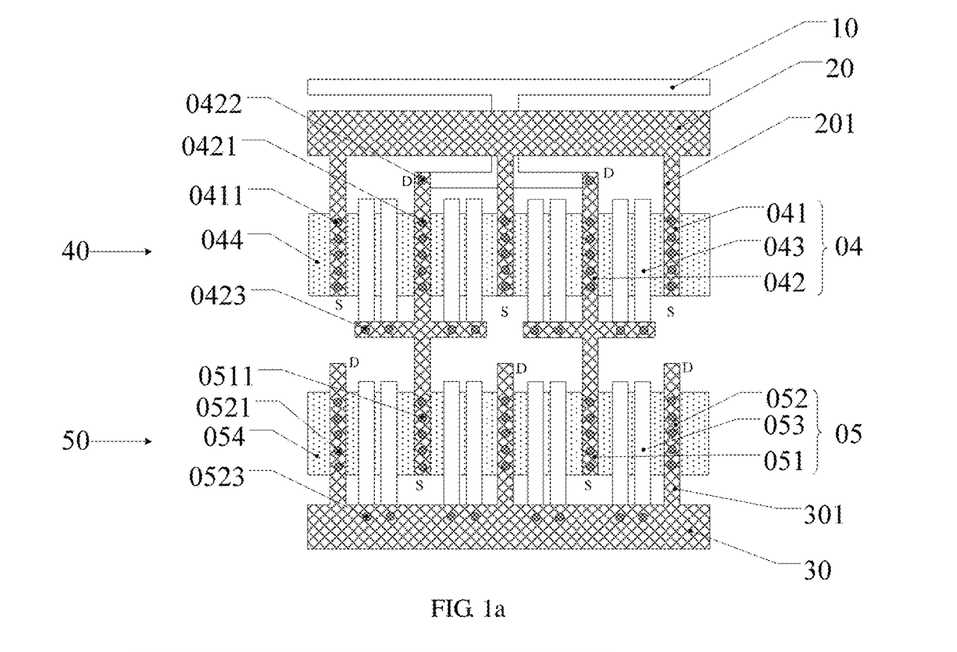
FIG. 1a is a schematic plan view of an ESD circuit provided by one embodiment of the present disclosure.

The embodiment provides an ESD circuit. As illustrated in FIG. 1a, the ESD circuit includes a first signal line 10, a second signal line 20, a third signal line 30, a first TFT 40 and a second TFT 50. The first TFT 40 includes a plurality of first sub-TFTs 04, and the second TFT 50 includes a plurality of second sub-TFTs 05. The first sub-TFTs 04 are in parallel connection, and the second sub-TFTs 05 are in parallel connection.

As illustrated in FIG. 1a, each first sub-TFT 04 includes a first source electrode 041 and a first drain electrode 042; the first sub-TFTs 04 are sequentially arranged; adjacent first sub-TFTs 04 share one first source electrode 041 or first drain electrode 042; the first signal line 10 is electrically connected with the first drain electrode 042 of each first sub-TFT 04 in the first TFT 40; and the second signal line 20 is electrically connected with the first source electrode 041 of each first sub-TFT 04 in the first TFT 40. For instance, as illustrated in FIG. 1a, in the first TFT 40, the first source electrodes 041 and the first drain electrodes 042 are sequentially and alternately arranged. For instance, the first source electrodes 041 and the first drain electrodes 042 are sequentially and alternately arranged in a direction parallel to a base substrate.

For instance, as illustrated in FIG. 1a, the first source electrodes 041 and the first drain electrodes 042 are alternately arranged; one first sub-TFT 04 is formed by each first source electrode 041 and a first drain electrode 042 adjacent to the first source electrode; and one first sub-TFT 04 is formed by each first drain electrode 042 and a first source electrode 041 adjacent to the first drain electrode.

For instance, as illustrated in FIG. 1a, two adjacent first sub-TFTs 04 include two first source electrodes 041 and a first drain electrode 042 disposed between the two first source electrodes 041, and the first drain electrode 042 is shared by the two adjacent first sub-TFTs; or the two adjacent first sub-TFTs 04 include two first drain electrodes 042 and a first source electrode 041 disposed between the two first drain electrodes 042, and the first source electrode 041 is shared by the two adjacent first sub-TFTs.

Each second TFT 05 includes a second source electrode 051 and a second drain electrode 052; the second sub-TFTs 05 are sequentially arranged; adjacent second sub-TFTs 05 share one second source electrode 051 or second drain electrode 052; the first signal line 10 is electrically connected with the second source electrode 051 of each second sub-TFT 05 in the second TFT 50; and the third signal line 30 is electrically connected with the second drain electrode 052 of each second sub-TFT 05 in the second TFT 50.

For instance, as illustrated in FIG. 1a, in the second TFT 50, the second source electrodes 051 and the second drain electrodes 052 are sequentially and alternately arranged. For instance, the second source electrodes 051 and the second drain electrodes 052 are sequentially and alternately arranged in a direction parallel to the base substrate.

For instance, as illustrated in FIG. 1a, the second source electrodes 051 and the second drain electrodes 052 are alternately arranged; one second sub-TFT 05 is formed by each second source electrode 051 and a second drain electrode 052 adjacent to the second source electrode; and one second sub-TFT 05 is formed by each second drain electrode 052 and a second source electrode 051 adjacent to the second drain electrode.

For instance, as illustrated in FIG. 1a, two adjacent second sub-TFTs 05 include two second source electrodes 051 and a second drain electrode 052 disposed between the two second source electrodes 051, and the second drain electrode 052 is shared by the two adjacent second sub-TFTs; or the two adjacent second sub-TFTs 05 include two second drain electrodes 052 and a second source electrode 051 disposed between the two second drain electrodes 052, and the second source electrode 051 is shared by the two adjacent second sub-TFTs.

For instance, as illustrated in FIG. 1a, the first sub-TFT 04 includes a first gate electrode 043 which is electrically connected with the first drain electrode 042; and the second sub-TFT 05 includes a second gate electrode 053 which is electrically connected with the second drain electrode 052. For instance, the first gate electrodes 043 of the plurality of first sub-TFTs 04 in the first TFT 40 are electrically connected with each other; and the second gate electrodes 053 of the plurality of second sub-TFTs 05 in the second TFT 50 are electrically connected with each other.

For instance, as illustrated in FIG. 1a, the first TFT 40 and the second TFT 50 are in series connection. For instance, the third signal line 30 is electrically connected with the plurality of second drain electrodes 052 of the second TFT 50; and the second source electrodes 051 of the second sub-TFTs 05 in the second TFT 50 are respectively electrically connected with the first signal line 10 through the first drain electrode 042 of one first sub-TFT 04 in the first TFT 40. Thus, the second source electrodes 051 of the second sub-TFTs 05 in the second TFT 50 are electrically connected with the first signal line 10.

Figure 1B:
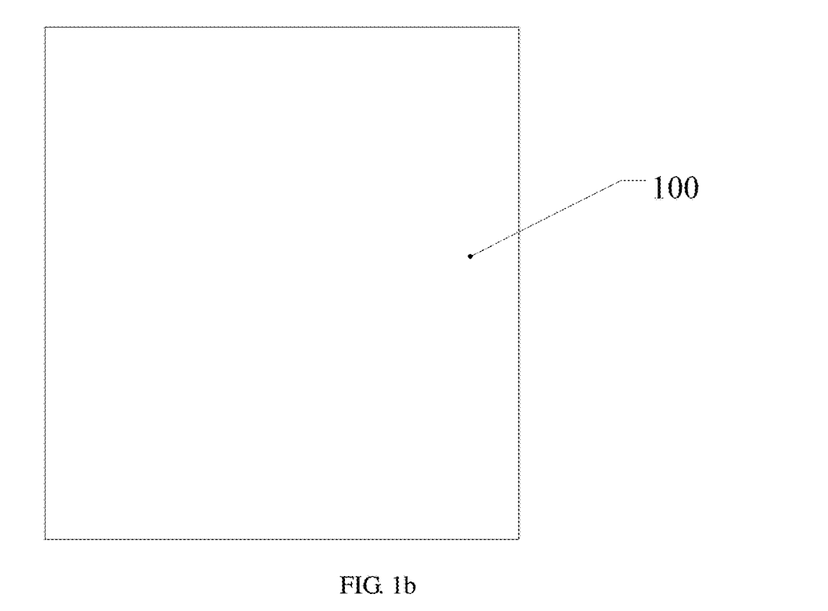
FIG. 1b is a schematic diagram of a first thin film for forming a pattern of a first signal line, first gate electrodes of first sub-TFTs, and second gate electrodes of second sub-TFTs in the ESD circuit provided by one embodiment of the present disclosure.
Figure 1C:
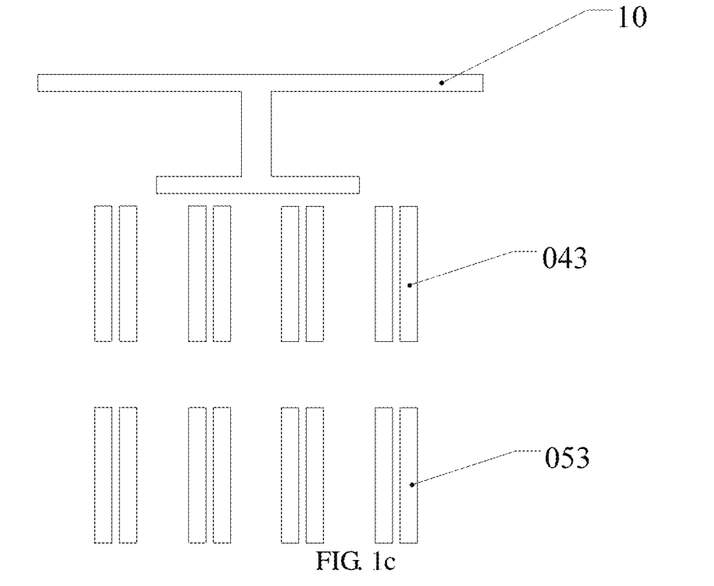
FIG. 1c is a schematic diagram of a pattern of a first signal line, first gate electrodes of first sub-TFTs, and second gate electrodes of second sub-TFTs in an ESD circuit provided by one embodiment of the present disclosure.

For instance, as illustrated in FIGS. 1b and 1c, the first signal line 10, the first gate electrodes 043 of the first sub-TFTs 04, and the second gate electrodes 053 of the second sub-TFTs 05 are formed by a first thin film 100. For instance, a first thin film 100 as illustrated in FIG. 1b is formed at first, and then a pattern as illustrated in FIG. 1c are formed by a patterning process. The pattern includes the first signal line 10, the first gate electrodes 043 of the first sub-TFTs 04, and the second gate electrodes 053 of the second sub-TFTs 05.

Figure 1D:
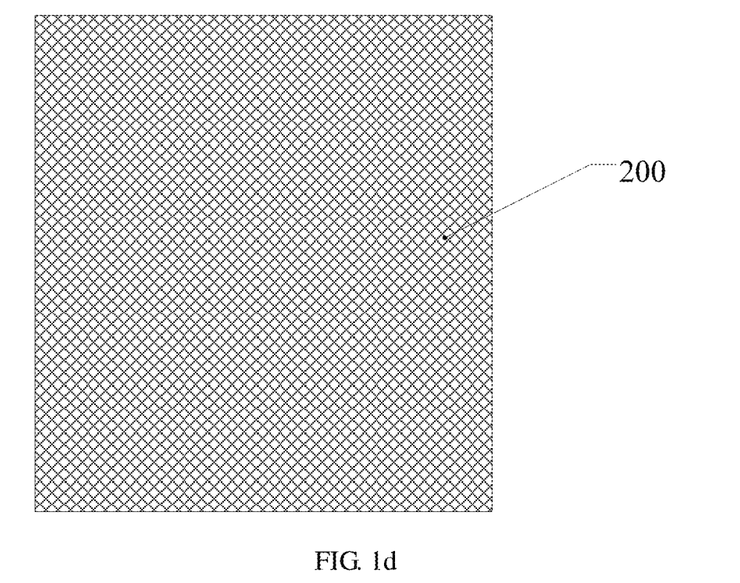
FIG. 1d is a schematic diagram of a second thin film for forming a pattern of first source electrodes and first drain electrodes of first sub-TFTs, second source electrodes and second drain electrodes of second sub-TFTs, a second signal line and a third signal line in an ESD circuit provided by one embodiment of the present disclosure.
Figure 1E:
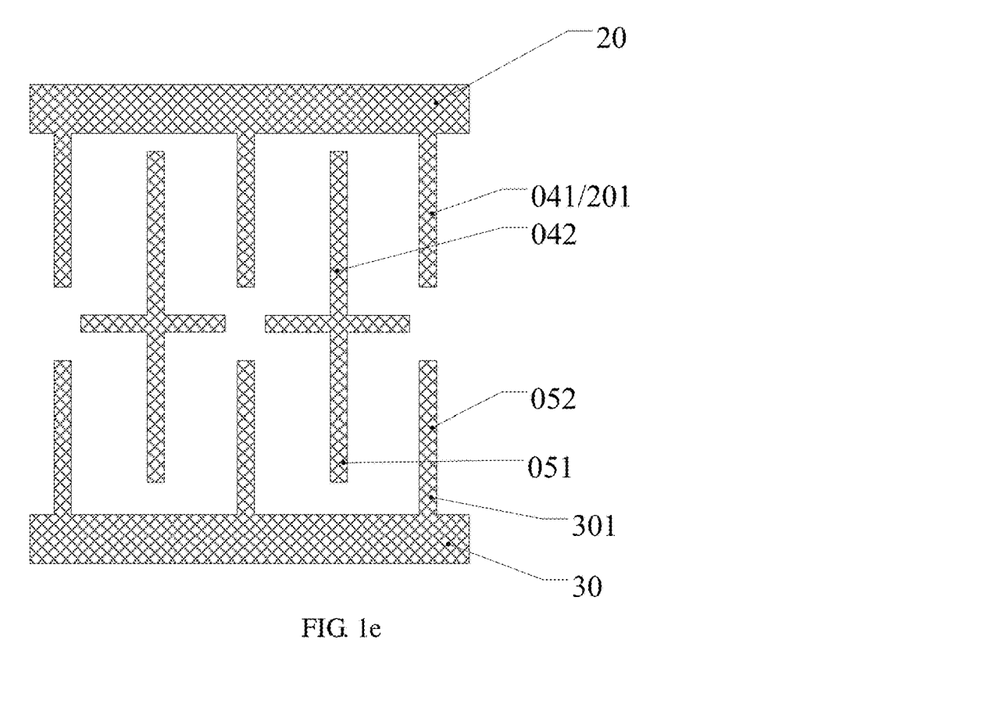
FIG. 1e is a schematic diagram of a pattern of first source electrodes and first drain electrodes of first sub-TFTs, second source electrodes and second drain electrodes of second sub-TFTs, a second signal line and a third signal line formed in an ESD circuit provided by one embodiment of the present disclosure.

For instance, as illustrated in FIGS. 1d and 1e, the first source electrodes 041 and the first drain electrodes 042 of the first sub-TFTs 04, the second source electrodes 051 and the second drain electrodes 052 of the second sub-TFTs 05, the second signal line 20 and the third signal line 30 are formed by a second thin film 200. For instance, a second thin film 200 as illustrated in FIG. 1d is formed at first, and then a pattern as illustrated in FIG. 1e are formed by a patterning process. The pattern includes the first source electrodes 041 and the first drain electrodes 042 of the first sub-TFTs 04, the second source electrodes 051 and the second drain electrodes 052 of the second sub-TFTs 05, the second signal line 20 and the third signal line 30.

For instance, as illustrated in FIGS. 1a and 1e, the second signal line 20 includes a plurality of branches 201; the plurality of branches 201 of the second signal line 20 is taken as the plurality of first source electrodes 041 of the first TFT 40; the third signal line 30 includes a plurality of branches 301; and the plurality of branches 301 of the third signal line 30 is taken as the plurality of second drain electrodes 052 of the second TFT 50. Thus, the manufacturing process can be simplified.

For instance, an insulating layer can be disposed between patterns formed by different thin films, and the patterns formed by different thin films can be electrically connected with each other via through holes of the insulating layer. For instance, the first drain electrode 042 is connected with the first signal line 10 via a through hole 0422. For instance, the first gate electrode 043 is electrically connected with the first drain electrode 042 via a through hole 0423, and the second gate electrode 053 is electrically connected with the second drain electrode 052 via a through hole 0523.

For instance, as illustrated in FIG. 1a, the first TFT 40 includes a first active layer 044; the first sub-TFTs 04 of the first TFT 40 respectively adopt different parts of the first active layer 044 of the first TFT 40; the second TFT 50 includes a second active layer 054; and the second sub-TFTs 05 of the second TFT 50 respectively adopt different parts of the second active layer 054 of the second TFT 50. For instance, the first source electrode 041 and the first drain electrode 042 of the first sub-TFT 04 are respectively connected with the first active layer 044 of the first TFT 40 via through holes 0411 and 0421; and the second source electrode 051 and the second drain electrode 052 of the second sub-TFT 05 are respectively connected with the second active layer 054 of the second TFT 50 via through holes 0511 and 0521.

Figure 1F:
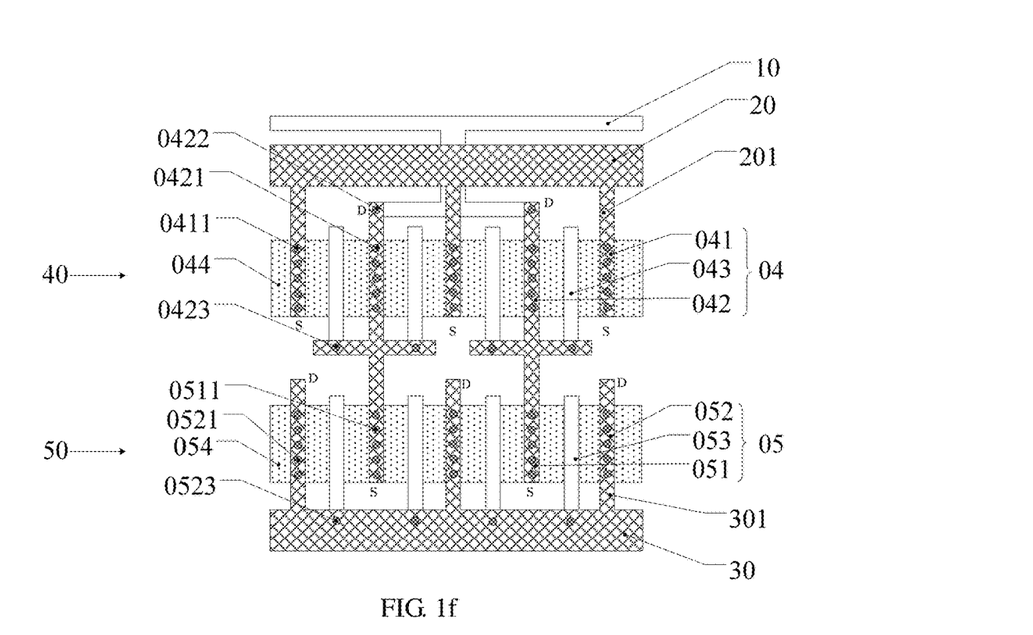
FIG. 1f is a schematic plan view of another ESD circuit provided by one embodiment of the present disclosure.

For instance, as illustrated in FIG. 1a, the first sub-TFT 04 is a dual gate TFT, and the second sub-TFT 04 is a dual gate TFT. Of course, as illustrated in FIG. 1f, the first sub-TFTs 04 and the second sub-TFTs 05 can also not adopt the dual gate structure. No limitation is given here.

For instance, in the ESD circuit provided by one example of the embodiment, both the number of the first sub-TFTs 04 in the first TFT 40 and the number of the second sub-TFTs 05 in the second TFT 50 are greater than or equal to 4.

For instance, the first TFT 40 is an N-type TFT; the second TFT 50 is an N-type TFT; the second signal line 20 is configured to apply a high level signal and taken as a high level signal line; and the third signal line 30 is configured to apply a low level signal and taken as a low level signal line. Positive electrostatic charges are released through the high level signal line, and negative electrostatic charges are released through the low level signal line. For instance, in the ESD circuit provided by one example of the embodiment, continuous high level signal can be applied to the second signal line 20, and continuous low level signal can be applied to the third signal line 30, which is not limited thereto. For instance, the second signal line 20 and the third signal line 30 can also be not provided with signals. No limitation will be given here in the embodiment of the present disclosure.

Figure 1G:
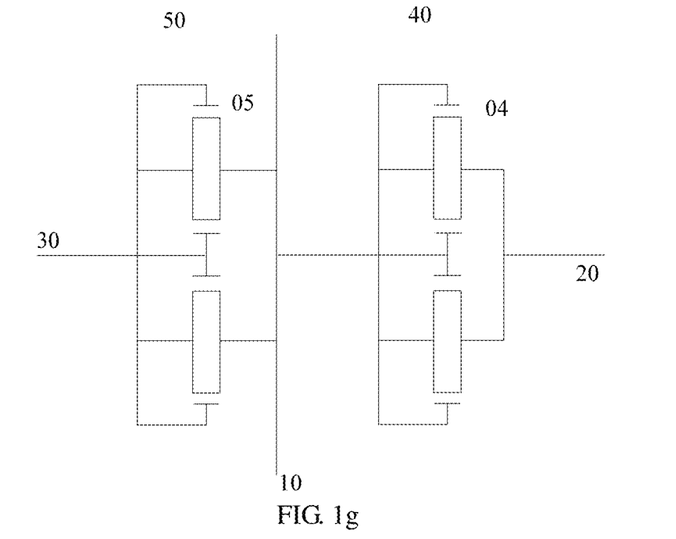
FIG. 1g is a schematic structural circuit diagram (equivalent circuit diagram) of an ESD circuit provided by one embodiment of the present disclosure.

For instance, a structural circuit diagram of the ESD circuit provided by one example of the embodiment can be as illustrated in FIG. 1g.

For instance, one example of the embodiment further provides a method for manufacturing an ESD circuit. The method can include the following steps: (1) forming a buffer layer on a base substrate; (2) forming a semiconductor layer on the buffer layer, in which the semiconductor layer includes a pattern of a first active layer and a second active layer; (3) forming a gate insulating layer on the semiconductor layer; (4) forming a pattern of first gate electrodes, second gate electrodes and a first signal line on the gate insulating layer; (5) forming an interlayer insulating layer on the pattern of the first gate electrodes, the second gate electrodes and the first signal line; (6) forming through holes of the interlayer insulating layer; and (7) forming a pattern of first source electrodes and first drain electrodes of first sub-TFTs, second source electrodes and second drain electrodes of second sub-TFTs, a second signal line and a third signal line on the interlayer insulating layer provided with the through holes.

For instance, in a method for manufacturing another ESD circuit, provided by one example of the embodiment, first gate electrodes and second gate electrodes are formed before a semiconductor layer is formed.

For instance, the buffer layer includes silicon nitride, silicon oxide or a double-layer film of silicon oxide and silicon nitride.

For instance, a material of the semiconductor layer includes amorphous silicon (a-Si), polycrystalline silicon (p-Si), metal oxide semiconductor materials, etc.; p-Si includes low-temperature polycrystalline silicon (LTPS); and the metal oxide semiconductors include zinc oxide (ZnO), indium gallium oxide (IGO), indium gallium zinc oxide (IGZO), etc.

For instance, the gate insulating layer includes silicon nitride and silicon oxide, can be a single-layer structure, and can also be a multi-layer structure, e.g., silicon oxide/silicon nitride.

For instance, the interlayer insulating layer can be made from inorganic matters such as silicon nitride and can also be made from organic matters such as resin.

For instance, the first gate electrodes, the second gate electrodes, the first source electrodes, the first drain electrodes, the second source electrodes, the second drain electrodes, the second signal line and the third signal line can all be made from metallic materials such as Cu, Al, Mo, Ti, Cr and W and can also be made from alloy of these materials; and can be a single-layer structure and can also be a multi-layer structure such as Mo/Al/Mo, Ti/Al/Ti, Ti/Cu/Ti and Mo/Cu/Ti.

For instance, the buffer layer and the gate insulating layer can be formed by a plasma enhanced chemical vapor deposition (PECVD) method.

It should be noted that the description on the materials of elements/components in the ESD circuit is only illustrative and not limitative; other suitable materials can also be adopted; and no limitation will be given here. The method for manufacturing the ESD circuit provided by the present disclosure is also not limited to the foregoing method.

Second Embodiment

The differences between an ESD circuit provided by the present embodiment and the ESD circuit provided by the first embodiment are that: the second signal line 20 is configured to apply a low level signal and taken as a low level signal line; the third signal line 30 is configured to apply a high level signal and taken as a high level signal line; the first TFT 40 is a P-type TFT; and the second TFT 50 is a P-type TFT. The remaining can refer to the description in the first embodiment.

Third Embodiment

Figure 2:
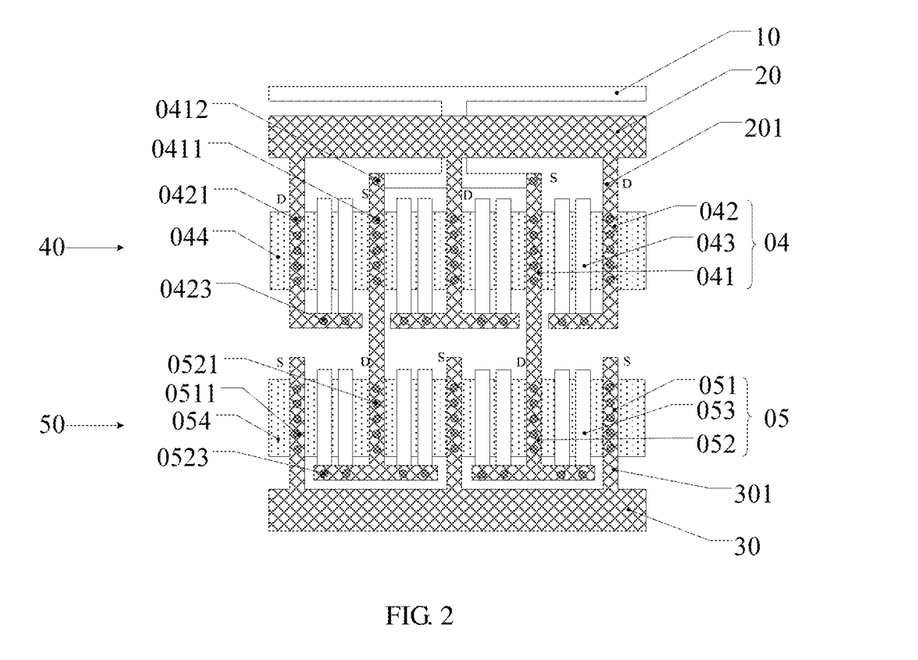
FIG. 2 is a schematic plan view of an ESD circuit provided by another embodiment of the present disclosure.

An ESD circuit provided by the present embodiment is as illustrated in FIG. 2. The differences between the present embodiment and the first embodiment are mostly as follows.

(1) The first TFT 40 is a P-type TFT, and the second TFT 50 is a P-type TFT.

(2) The plurality of branches 201 of the second signal line 20 is taken as a plurality of first drain electrodes 042 of the first TFT 40, and the first signal line is electrically connected with first source electrodes of the first TFT. That is to say, the first source electrodes in the first embodiment are the first drain electrodes 042 in the embodiment, and correspondingly, the first drain electrodes in the first embodiment are the first source electrodes 041 in the embodiment.

(3) First source electrodes 041 are connected with the first signal line 10 via through holes 0412.

(4) The plurality of branches 301 of the third signal line 30 is taken as the plurality of second source electrodes 051 of the second TFT 50, namely the second drain electrodes in the first embodiment are the second source electrodes 051 in the embodiment. Correspondingly, the second source electrodes in the first embodiment are second drain electrodes 052 in the embodiment.

(5) The second drain electrodes 052 of second sub-TFTs 05 in the second TFT 50 are respectively electrically connected with the first signal line 10 through the first source electrode 041 of one first sub-TFT 04 in the first TFT 40. Thus, the second drain electrodes 052 of the second sub-TFTs 05 in the second TFT 50 are electrically connected with the first signal line 10.

The remaining can refer to the description in the first embodiment. It should be noted that: in the first sub-TFTs, first gate electrodes are still electrically connected with the first drain electrodes; and in the second sub-TFTs, second gate electrodes are still electrically connected with the second drain electrodes. The second signal line 20 is still configured to apply a high level signal line and taken as a high level signal line, and the third signal line 30 is still configured to apply a low level signal line and taken as a low level signal line.

Fourth Embodiment

The differences between an ESD circuit provided by the present embodiment and the ESD circuit provided by the third embodiment are that: the second signal line 20 is configured to apply a low level signal and taken as a low level signal line; the third signal line 30 is configured to apply a high level signal and taken as a high level signal line; the first TFT 40 is an N-type TFT; and the second TFT 50 is an N-type TFT. The remaining can refer to the description in the third embodiment.

Fifth Embodiment

Figure 3:
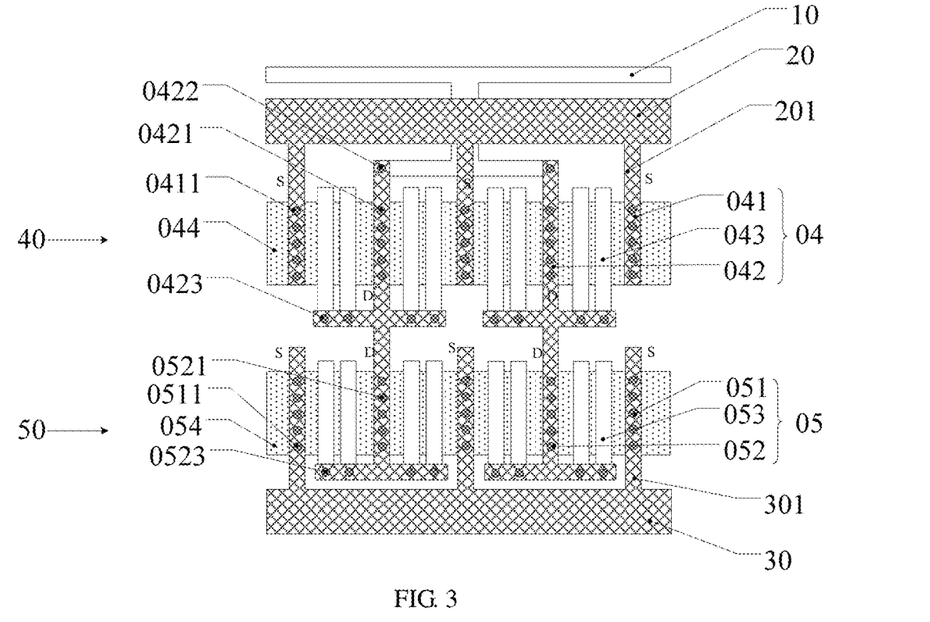
FIG. 3 is a schematic plan view of an ESD circuit provided by another embodiment of the present disclosure.

The present embodiment provides an ESD circuit. As illustrated in FIG. 3, the differences between the ESD circuit of the present embodiment and the ESD circuit provided by the first embodiment are as follows.

(1) The second TFT 50 is a P-type TFT.

(2) The plurality of branches 301 of the third signal line 30 is taken as a plurality of second source electrodes 051 of the second TFT 50, namely the second drain electrodes in the first embodiment are the second source electrodes 051 in the present embodiment. Correspondingly, the second source electrodes in the first embodiment are second drain electrodes 052 in the embodiment.

(3) The second drain electrodes 052 of second sub-TFTs 05 in the second TFT 50 are respectively electrically connected with the first signal line 10 through a first drain electrode 042 of one first sub-TFT 04 in a first TFT 40. Thus, the second drain electrodes 052 of the second sub-TFTs 05 in the second TFT 50 are electrically connected with the first signal line 10.

The remaining can refer to the description in the first embodiment. It should be noted that the first TFT 40 is still an N-type TFT. In the first sub-TFT, a first gate electrode is still electrically connected with the first drain electrode; and in the second sub-TFT, a second gate electrode is still electrically connected with the second drain electrode. The second signal line 20 is still a high level signal line, and the third signal line 30 is still a low level signal line.

Sixth Embodiment

The ESD circuit provided by the present embodiment is as illustrated in FIG. 3*b*. The differences between the ESD circuit provided by the present embodiment and the ESD circuit provided by the fifth embodiment are that: the second signal line 20 is configured to apply a low level signal and taken as a low level signal line; the third signal line 30 is configured to apply a high level signal and taken as a high level signal line; the first TFT 40 is a P-type TFT; and the second TFT 50 is an N-type TFT. The remaining can refer to the description in the fifth embodiment.

Seventh Embodiment

Figure 4:
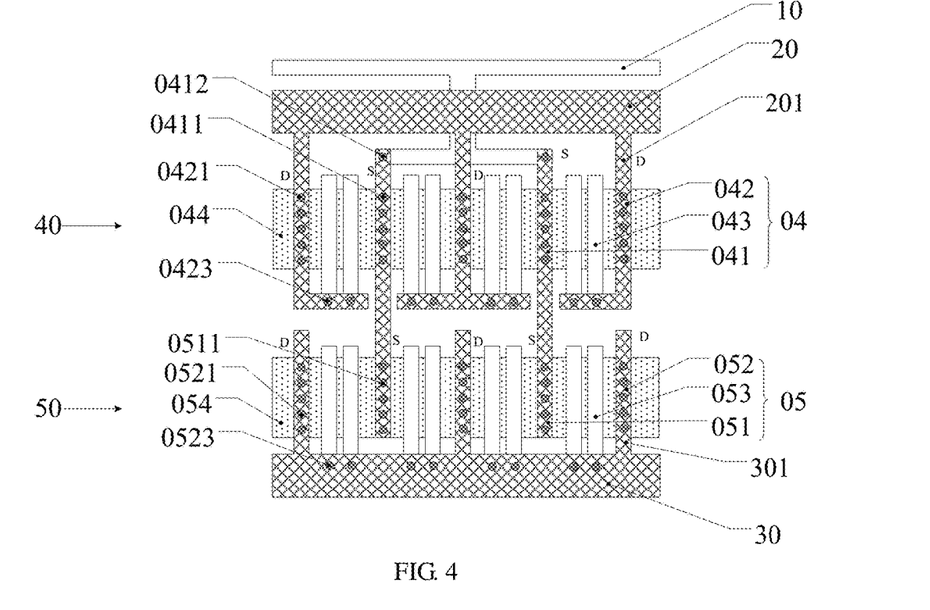
FIG. 4 is a schematic plan view of an ESD circuit provided by still another embodiment of the present disclosure.

The ESD circuit provided by the present embodiment is as illustrated in FIG. 4. The differences between the ESD circuit provided by the present embodiment and the ESD circuit provided by the first embodiment are as follows.

(1) The first TFT 40 is a P-type TFT.

(2) The plurality of branches 201 of a second signal line 20 is taken as the plurality of first drain electrodes 042 of the first TFT 40; and a first signal line is electrically connected with a plurality of first source electrodes of the first TFT. That is to say, the first source electrodes in the first embodiment are the first drain electrodes 042 in the present embodiment, and correspondingly, the first drain electrodes in the first embodiment are the first source electrodes 041 in the embodiment.

(3) The first source electrodes 041 are connected with the first signal line 10 via through holes 0412.

(4) The second source electrodes 051 of second sub-TFTs 05 in the second TFT 50 are respectively electrically connected with the first signal line 10 through the first source electrode 041 of one first sub-TFT 04 in the first TFT 40. Thus, the second source electrodes 051 of the second sub-TFTs 05 in the second TFT 50 are electrically connected with the first signal line 10.

The remaining can refer to the description in the first embodiment. It should be noted that: in the first sub-TFT, a first gate electrode is still electrically connected with the first drain electrode; and in the second sub-TFT, a second gate electrode is still electrically connected with the second drain electrode. The second TFT 50 is still an N-type TFT. The second signal line 20 is still configured to apply a high level signal and taken as a high level signal line. A third signal line 30 is still configured to apply a low level signal and taken as a low level signal line.

Eighth Embodiment

The ESD circuit provided by the present embodiment is as illustrated in FIG. 4*b*. The differences between the ESD circuit provided by the present embodiment and the ESD circuit provided by the seventh embodiment are that: a second signal line 20 is configured to apply a low level signal and taken as a low level signal line; the third signal line 30 is configured to apply a high level signal and taken as a high level signal line; the first TFT 40 is an N-type TFT; and the second TFT 50 is a P-type TFT. The remaining can refer to the description in the seventh embodiment.

Ninth Embodiment

The embodiment provides an array substrate, which includes any ESD circuit provided by any foregoing embodiment.

Figure 5:
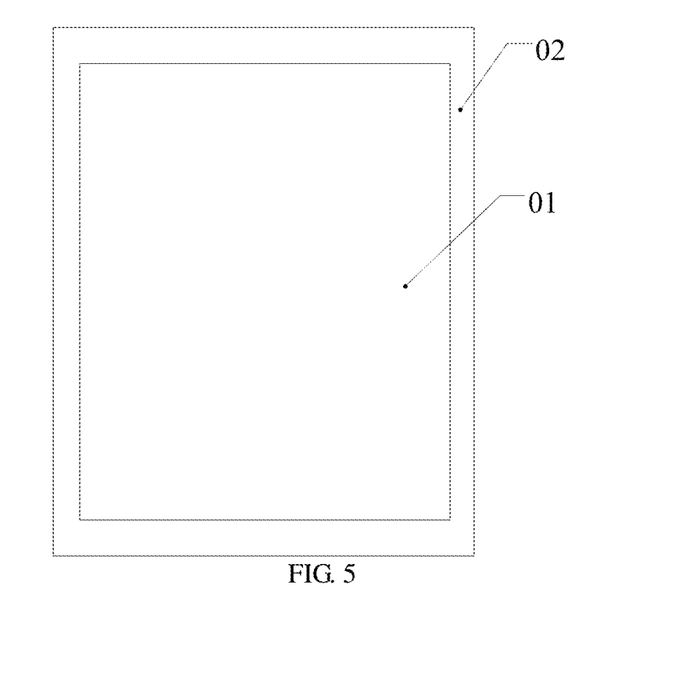
FIG. 5 is a schematic diagram of a display region and a peripheral region disposed on an outside of the display region, in an array substrate provided by one embodiment of the present disclosure.

For instance, in one example of the embodiment, as illustrated in FIG. 5, the array substrate includes a display region 01 and a peripheral region 02 disposed on an outside of the display region 01, and the ESD circuit can be disposed in the peripheral region 02. For instance, the peripheral region can be disposed on at least one side of the display region, or the peripheral region can be disposed around the display region. For instance, the display region can also be provided with TFTs, pixel electrodes electrically connected with drain electrodes of the TFTs, etc. No detailed description will be given here. For instance, the display region 01 is disposed in the middle of the array substrate, for instance, be surrounded by the peripheral region 02. For instance, the display region 01 includes a plurality of subpixel units arranged in an array, and each subpixel unit includes a TFT taken as a switching element to control the on/off of the subpixel unit.

For instance, in one example of the embodiment, the array substrate can further include a driver IC which is configured to provide a driving signal to the second signal line and/or the third signal line, so as to realize ESD.

Tenth Embodiment

The embodiment provides a display device, which includes any array substrate provided by the ninth embodiment.

The following statements should be noted:

(1) In the present disclosure, a photolithography process includes forming a pattern by processes such as film forming, exposure, and development etc., by using photoresist, mask, exposure machine etc. A patterning process can only include a photolithography process, or include a photolithography process and an etching process, or include other processes to form a preset pattern such as a printing process, and an inkjet process, no limitation will be given here.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(4) In case of no conflict, features in one embodiment or in different embodiments can be combined.

(5) Unless otherwise defined, the same reference numeral denotes the same element/component.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

This application claims the benefit of priority from Chinese patent application No. 201620363192.7, filed on Apr. 26, 2016, the disclosure of which is incorporated herein in its entirety by reference as a part of the present application.

What is claimed is:

1. An electrostatic discharge (ESD) circuit, comprising a first signal line, a second signal line, and a first thin film transistor (TFT), wherein the first TFT comprises a plurality of first sub-TFTs;

each first sub-TFT comprises a first source electrode and a first drain electrode; the first sub-TFTs are sequentially arranged; adjacent first sub-TFTs share one first source electrode or first drain electrode; one of the first signal line and the second signal line is electrically connected with the first drain electrode of each first sub-TFT; and the other of the first signal line and the second signal line is electrically connected with the first source electrode of each first sub-TFT; and wherein the first signal line comprises a first sub-line, a second sub-line, and a connection portion connecting the sub-line with the second sub-line, the first sub-line and the second sub-line are arranged on different sides of the second signal line, the connection portion goes across the second signal line, and the connection portion forms an inverted T-shaped structure with the second sub-line and forms a T-shaped structure with the first sub-line.

2. The ESD circuit according to claim 1, wherein two adjacent first sub-TFTs comprise two first source electrodes and a first drain electrode disposed between the two first source electrodes, and the first drain electrode is shared by the two adjacent first sub-TFTs; or the two adjacent first sub-TFTs comprise two first drain electrodes and a first source electrode disposed between the two first drain electrodes, and the first source electrode is shared by the two adjacent first sub-TFTs.

3. The ESD circuit according to claim 1, further comprising a third signal line and a second TFT, wherein the second TFT comprises a plurality of second sub-TFTs; each second sub-TFT comprises a second source electrode and a second drain electrode; the second sub-TFTs are sequentially arranged; two adjacent second sub-TFTs share one second source electrode or second drain electrode; one of the first signal line and the third signal line is electrically connected with the second source electrode of each second sub-TFT; and the other of the first signal line and the third signal line is electrically connected with the second drain electrode of each second sub-TFT.

4. The ESD circuit according to claim 3, wherein two adjacent second sub-TFTs comprise two second source electrodes and a second drain electrode disposed between the two second source electrodes, and the second drain electrode is shared by the two adjacent second sub-TFTs; or the two adjacent second sub-TFTs comprise two second drain electrodes and a second source electrode disposed between the two second drain electrodes, and the second source electrode is shared by the two adjacent second sub-TFTs.

5. The ESD circuit according to claim 3, wherein the first TFT and the second TFT are in series connection.

6. The ESD circuit according to claim 5, wherein the third signal line is electrically connected with the second drain electrodes, and the second source electrode is electrically connected with the first signal line through at least one first drain electrode or first source electrode; or the third signal line is electrically connected with the second source electrodes, and the second drain electrode is electrically connected with the first signal line through at least one first drain electrode or first source electrode.

7. The ESD circuit according to claim 3, wherein one of the second signal line or the third signal line is configured to apply a high level signal and taken as a high level signal line, and the other is configured to apply a low level signal and taken as a low level signal line.

8. The ESD circuit according to claim 3, wherein the second signal line and the third signal line are configured to apply an equal level signal and taken as equal level signal lines.

9. The ESD circuit according to claim 3, wherein the first TFT and the second signal line are configured to release positive electrostatic charges accumulated on the first signal line, and the second TFT and the third signal line are configured to release negative electrostatic charges accumulated on the first signal line; or the first TFT and the second signal line are configured to release negative electrostatic charges accumulated on the first signal line, and the second TFT and the third signal line are configured to release positive electrostatic charges accumulated on the first signal line.

10. An electrostatic discharge (ESD) circuit, comprising a first signal line, a second signal line, and a first thin film transistor (TFT), wherein the first TFT comprises a plurality of first sub-TFTs;
each first sub-TFT comprises a first source electrode and a first drain electrode; the first sub-TFTs are sequentially arranged; adjacent first sub-TFTs share one first source electrode or first drain electrode; one of the first signal line and the second signal line is electrically connected with the first drain electrode of each first sub-TFT; and the other of the first signal line and the second signal line is electrically connected with the first source electrode of each first sub-TFT;
wherein the ESD circuit further comprises a third signal line and a second TFT, the second TFT comprises a plurality of second sub-TFTs; each second sub-TFT comprises a second source electrode and a second drain electrode; the second sub-TFTs are sequentially arranged; two adjacent second sub-TFTs share one second source electrode or second electrode; one of the first signal line and the third signal line is electrically connected with the second source electrode of each second sub-TFT; and the other of the first signal line and the third signal line is electrically connected with the second drain electrode of each second sub-TFT;
wherein each first sub-TFT comprises a first gate electrode which is electrically connected with the first drain electrode or the first source electrode; and each second sub-TFT comprises a second gate electrode which is electrically connected with the second drain electrode or the second source electrode; and
wherein the first gate electrodes in the plurality of first sub-TFTs are connected with the first signal line, and the second source electrodes in the plurality of second sub-TFTs are connected with the third signal line.

11. The ESD circuit according to claim 10, wherein the first gate electrodes in the plurality of first sub-TFTs are electrically connected with each other, and wherein the second gate electrodes in the plurality of second sub-TFTs are electrically connected with each other.

12. The ESD circuit according to claim 10, wherein the first signal line, the first gate electrode of each of the first sub-TFTs, and the second gate electrode of each of the second sub-TFTs are formed by a first thin film.

13. The ESD circuit according to claim 3, wherein the first source electrode and the first drain electrode of each of the first sub-TFTs, the second source electrode and the second drain electrode of each of the second sub-TFTs, the second signal line and the third signal line are formed by a second thin film.

14. The ESD circuit according to claim 3, wherein the second signal line comprises a plurality of branches; the plurality of branches of the second signal line is taken as the first source electrodes or the first drain electrodes of the first TFT; the third signal line comprises a plurality of branches; and the plurality of branches of the third signal line is taken as the second drain electrodes or the second source electrodes of the second TFT.

15. The ESD circuit according to claim 3, wherein the first TFT comprises a first active layer, and the first sub-TFTs respectively adopt different parts of the first active layer of the first TFT, and wherein the second TFT comprises a second active layer, and the second sub-TFTs respectively adopt different parts of the second active layer of the second TFT.

16. The ESD circuit according to claim 15, wherein the first source electrode and the first drain electrode of each of the first sub-TFTs are respectively connected with the first active layer of the first TFT via through holes; and the second source electrode and the second drain electrode of each of the second sub-TFTs are respectively connected with the second active layer of the second TFT via through holes.

17. The ESD circuit according to claim 3, wherein both the number of the first sub-TFTs and the number of the second sub-TFTs are greater than or equal to 4.

18. An array substrate, comprising the ESD circuit according to claim 1.

19. A display device, comprising the array substrate according to claim 18.

20. An electrostatic discharge (ESD) circuit, comprising a first signal line, a second signal line, and a first thin film transistor (TFT), wherein the first TFT comprises a plurality of first sub-TFTs;
each first sub-TFT comprises a first source electrode and a first drain electrode; the first sub-TFTs are sequentially arranged; adjacent first sub-TFTs share one first source electrode or first drain electrode; one of the first signal line and the second signal line is electrically connected with the first drain electrode of each first sub-TFT; and the other of the first signal line and the second signal line is electrically connected with the first source electrode of each first sub-TFT;
wherein the ESD circuit further comprises a third signal line and a second TFT, the second TFT comprises a plurality of second sub-TFTs; each second sub-TFT comprises a second source electrode and a second drain electrode; the second sub-TFTs are sequentially arranged; two adjacent second sub-TFTs share one second source electrode or second drain electrode; one of the first signal line and the third signal line is electrically connected with the second source electrode of each second sub-TFT; and the other of the first signal line and the third signal line is electrically connected with the second drain electrode of each second sub-TFT;
wherein each first sub-TFT comprises a first gate electrode electrically connected with the first drain electrode of the first sub-TFT to which the first gate electrode and the first drain electrode belong; and each second sub-TFT comprises a second gate electrode electrically connected with the second drain electrode of the second sub-TFT to which the second gate electrode and the second drain electrode belong; and wherein the first gate electrodes in the plurality of first sub-TFTs are connected with the second signal line, the second source electrodes in the plurality of second sub-TFTs are connected with the third signal line, the first signal line and the second signal line are arranged on a same side of the first TFT, and the second signal line and the third signal line are arranged on opposite sides of the second TFT.

* * * * *